United States Patent [19]
Bakhmutsky et al.

[11] Patent Number: 5,798,717
[45] Date of Patent: Aug. 25, 1998

[54] ONE-HOT OVERFLOW MATRIX WITH ENHANCED ARCHITECTURE AND ONE-HOT VARIABLE LENGTH DECODER INCORPORATING THE SAME

[75] Inventors: Michael Bakhmutsky, Spring Valley; Viktor L. Gornstein, New York, both of N.Y.

[73] Assignee: Philips Electronics North America Corporation, New York, N.Y.

[21] Appl. No.: 671,891

[22] Filed: Jun. 28, 1996

Related U.S. Application Data

[63] Continuation-in-part of Ser. No. 583,149, Dec. 28, 1995, Pat. No. 5,657,016.

[51] Int. Cl.$^6$ ............................................. H03M 7/40
[52] U.S. Cl. .................................. 341/50; 341/67
[58] Field of Search ............................ 341/50, 59, 65, 341/67; 358/261.1, 261.2, 261.3

[56] References Cited

U.S. PATENT DOCUMENTS

| | | | |
|---|---|---|---|
| 5,173,695 | 12/1992 | Sun et al. | 341/67 |
| 5,363,097 | 11/1994 | Jan | 341/67 |
| 5,572,682 | 11/1996 | Garibay et al. | 395/250 |
| 5,638,069 | 6/1997 | Rensink et al. | 341/67 |

FOREIGN PATENT DOCUMENTS

| | | |
|---|---|---|
| 0614317 | 9/1994 | European Pat. Off. |
| 0631440 | 12/1994 | European Pat. Off. |

Primary Examiner—Brian K. Young

[57] ABSTRACT

A one-hot overflow matrix which includes a first one-hot input comprised of a plurality n of parallel bits arranged in sequence from a zero bit position to an (n−1) bit position, a second one-hot input comprised of a plurality n of parallel bits arranged in sequence from a zero bit position to an (n−1) bit position, a plurality n of output gates (e.g., tri-state buffers) each having a first input, a second input, and an output, a data output line commonly coupled to the output of each of the output gates, a plurality n/2 of NOR gates each having one or more data inputs, and a data output, and a plurality (n/2−1) of OR gates each having one or more data inputs, and a data output. The data input(s) of each respective ith one of the NOR gates are respectively coupled to the zero bit position through ((n−1)−i) bit position bit(s) of the second one-hot input. The first input of each respective ith one of the output gates is coupled to the data output of a corresponding ith one of the NOR gates, and the second input of each respective ith one of the output gates is coupled to a corresponding ith bit position bit of the first one-hot input. The data input(s) of each respective jth one of the OR gates are respectively coupled to the (n−j) bit position through (n−1) bit position bits of the second one-hot input, where i=n/2 through (n−1), and j=(n/2−1) through 1.

19 Claims, 6 Drawing Sheets

ONE-HOT OVERFLOW MATRIX WITH ENHANCED ARCHITECTURE AND ONE-HOT VARIABLE LENGTH DECODER INCORPORATING THE SAME

RELATED APPLICATIONS

This is a continuation-in-part of application Ser. No. 08/583,149 filed Dec. 28, 1995, now U.S. Pat. No. 5,657, 016, for an invention entitled "One-Hot Variable Length Decoder". The inventors and assignee are the same for both this application and the above-identified prior application.

BACKGROUND OF THE INVENTION

The present invention relates generally to variable length decoders used in data transmission systems, and more particularly, to a one-hot overflow matrix with enhanced architecture, and a variable length decoder for decoding digital video data for high definition television (HDTV), which incorporates the same.

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, however, where the peak symbol rate is about 100 million code words per second, decoding the whole picture at the symbol rate with a single variable length decoder becomes impractical. In HDTV systems, the variable length decoder (VLD) is used to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol, a VLD throughput of 100 million or more code words per second is required. In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs requires eight ping-pong buffers, each one of the ping-pong buffers being twice the size of the rate buffer, thereby increasing the amount of required buffer memory by a factor of sixteen over a system having a single VLD.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data.

The invention disclosed herein and in the above-identified prior application fulfills this need in the art by providing a variable length decoder having a word length computation loop which is implemented in a one-hot architecture, referred to herein as a "one-hot VLD". The one-hot architecture of the word length computation loop of the one-hot VLD significantly reduces the propagation delay through the word length computation loop relative to the word length computation loop used in the conventional VLDs, such as the one disclosed in the above-referenced Sun et al. patent, and thereby greatly accelerates the word length computation loop, thus facilitating greater throughput.

In this regard, the one-hot word length computation loop of the one-hot VLD eliminates the layers of logic gates required in the conventional word length computation loop, which includes a wide-barrel shifter, a conventional word length decoder with large Huffman look-up tables, and an adder-accumulator.

With the one-hot architecture of the word length computation loop of a preferred embodiment of the one-hot VLD, the wide-barrel shifter is replaced by a "one-hot" bit stream barrel shifter matrix, the conventional word length decoder is replaced by a "one-hot" word length decoder, and the adder is replaced by a "one-hot" ring barrel shifter matrix and "one-hot" overflow barrel shifter matrix. Alternatively, significant acceleration of the word length computation loop can be achieved even if conventional barrel shifters are used instead of the "one-hot" barrel shifter matrices.

Figure 4:
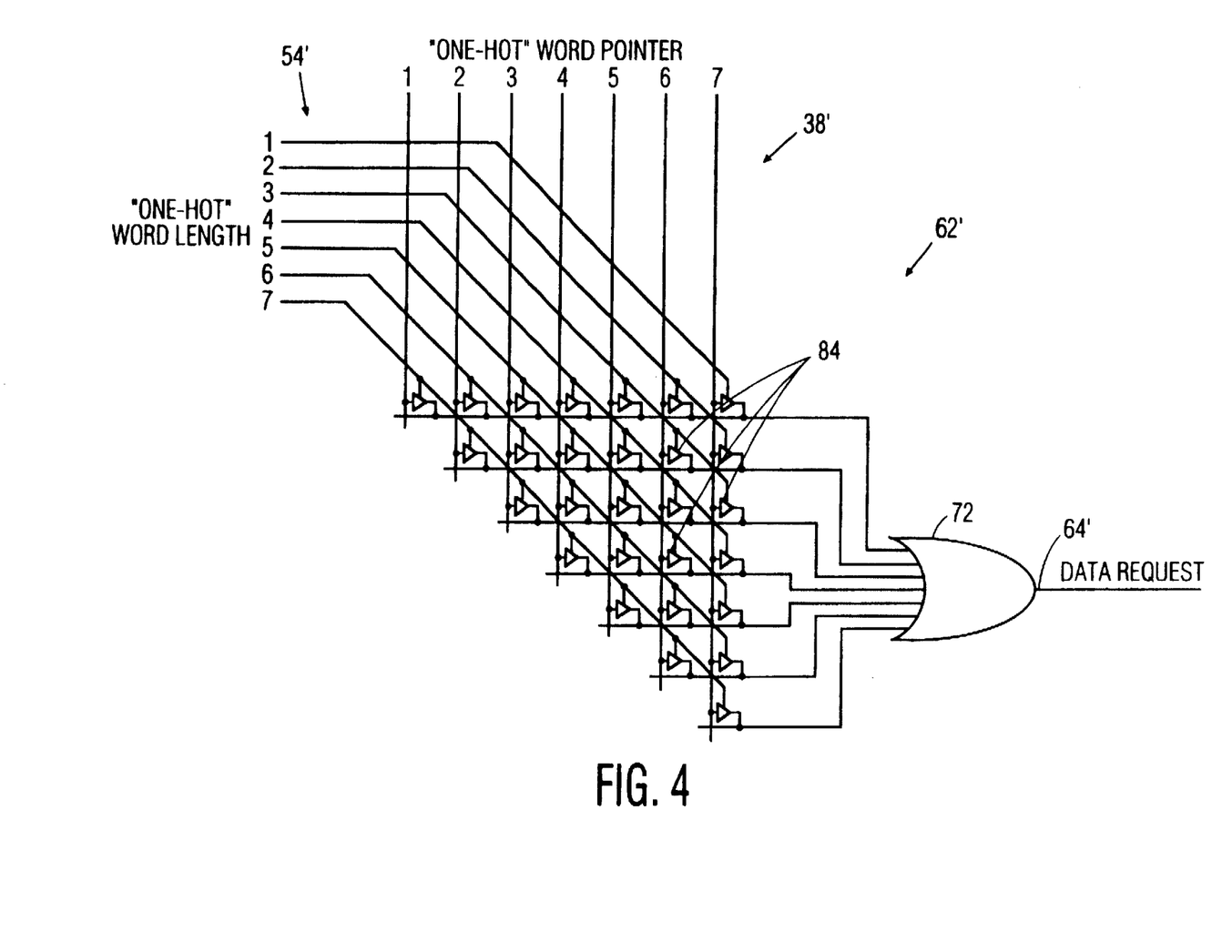
FIG. 4 is a schematic diagram of a "one-hot" overflow barrel shifter matrix constructed in accordance with the teachings of the prior application.

Although the specific implementation of the one-hot overflow matrix of the above-referenced preferred embodiment of the one-hot VLD which is disclosed in the prior application and depicted in FIG. 4 herein is theoretically capable of introducing a signal propagation delay between the input and output thereof equal to the combined propagation delay of just two logic gates (e.g., the propagation delay of a tri-state buffer+the propagation delay of an OR gate), in actual practice, the signal propagation delay introduced by a one-hot overflow matrix with this architecture is greater than that for one-hot inputs (i.e., one-hot word length and one-hot word pointer inputs) having a number of bits n greater than x, where x is the maximum number of inputs for an OR gate readily available in silicon, e.g., x=5. In this connection, when the one-hot VLD is implemented in silicon (preferably in CMOS), an OR gate having 31 inputs (as would be required for the case where n=32) is not directly available in most ASIC ("Application Specific Integrated Circuit") libraries, and is normally implemented by cascading several OR gates of smaller width.

Consequently, when the value of n>x, the one-hot overflow matrix implemented with an architecture such as shown in FIG. 4, in actual practice, due to unavailability of ASICs having OR gates with the requisite number of inputs, introduces a signal propagation delay equivalent to the propagation delay of three to four cascaded OR gates, thereby significantly decreasing the actually realizable speed of operation of the one-hot VLD, and thus minimizing the actual benefits derived from using the one-hot VLD, i.e., increased speed of the word length computation loop and increased throughput. In other words, the one-hot overflow matrix depicted in FIG. 4 imposes a practical constraint on the speed of the word length computation loop which can be actually realized by using the one-hot VLD, and thus, on the throughput of the one-hot VLD.

In addition, the one-hot overflow matrix depicted in FIG. 4 requires pull-down resistors to be connected to the respective inputs of the OR gate, since any input of the OR gate could otherwise be put into an undefined ("floating") state if none of the gates connected to this input are enabled, thereby creating uncertainty of the output signal generated by the one-hot overflow matrix (i.e., the overflow signal/bit). Moreover, the fact that such pull-down resistors are not available in most ASIC high-speed CMOS libraries imposes an additional practical constraint on the implementation of the one-hot VLD using the one-hot overflow matrix depicted in FIG. 4.

Based on the above, it can be readily appreciated that there exists a need for a one-hot overflow matrix (and a one-hot VLD incorporating the same) which overcomes the above-described shortcomings of the one-hot overflow matrix disclosed in the above-identified prior application and depicted in FIG. 4 herein. The present invention fulfills this need.

SUMMARY OF THE INVENTION

The present invention encompasses a one-hot overflow matrix which includes a first one-hot input comprised of a plurality n of parallel bits, a second one-hot input comprised of a plurality n of parallel bits, a plurality n of output gates (e.g., tri-state buffers) each having a first input, a second input, and an output, a logic matrix comprised of a plurality n of rows and a plurality n of columns of matrix gates (e.g., tri-state buffers), each of the matrix gates having a data input, a control input, and an output, a plurality n of buffer output lines, respective ith ones of the buffer output lines being commonly coupled to the output of each matrix gate of a corresponding ith row of the matrix gates, and a data output line commonly coupled to the output of each of the output gates.

The data input of the first j ones of the matrix gates of each ith row of the matrix gates are each coupled to a reference potential, and the data input of the next k ones of the matrix gates of each ith row of the matrix gates are each coupled to the corresponding ith bit of the first one-hot input, where i=0 through (n-1); j=n-i; k=i, and, j+k=n. The control input of each one of the matrix gates of each ith column of the matrix gates are coupled to the corresponding ith bit of the second one-hot input. The output of each of the matrix gates of each ith row of the matrix gates is coupled to a common ith one of the buffer output lines. The first input of each ith one of the output gates is coupled to the corresponding ith bit of the one-hot input, and the second input of each ith one of the output gates is coupled to the corresponding ith one of the buffer output lines.

The present invention also encompasses a one-hot overflow matrix which includes a first one-hot input comprised of a plurality n of parallel bits, a second one-hot input comprised of a plurality n of parallel bits, a plurality n of output gates (e.g., tri-state buffers) each having a first input, a second input, and an output, a logic matrix comprised of a plurality n of rows of matrix gates (e.g., tri-state buffers), including n−1 non-zero-bit rows of matrix gates, each non-zero-bit row including a plurality n of matrix gates, and a single zero-bit row comprised of a single matrix gate, each of the matrix gates having a data input, a control input, and an output, a plurality n of buffer output lines, respective ith ones of the buffer output lines being commonly coupled to the output of each matrix gate of a corresponding ith row of the matrix gates, and a data output line commonly coupled to the output of each of the output gates.

The data input of the first j ones of the matrix gates of each ith non-zero-bit row of the matrix gates are each coupled to a reference potential (e.g., ground), and the data input of the next k ones of the matrix gates of each ith non-zero-bit row of the matrix gates are each coupled to the corresponding ith non-zero bit of the first one-hot input (e.g., one-hot word length input), where i=0 through (n−1); j=n−i; k=i, and, j+k=n.

The data input of the single matrix gate of the zero-bit row is coupled to the reference potential. The control input of each one of the matrix gates of each ith column of the matrix gates are coupled to the corresponding ith bit of the second one-hot input (e.g., one-hot word pointer input). The control input of the single matrix gate of the zero-bit row is coupled to the corresponding zero bit of the first one-hot input. The output of each of the matrix gates of each ith row of the matrix gates is coupled to a common ith one of the buffer output lines. The first input of each ith one of the output gates is coupled to the corresponding ith bit of the one-hot input, and the second input of each ith one of the output gates is coupled to the corresponding ith one of the buffer output lines.

The present invention also encompasses a one-hot overflow matrix which includes a first one-hot input comprised of a plurality n of parallel bits arranged in sequence from a zero bit position to an (n−1) bit position, a second one-hot input comprised of a plurality n of parallel bits arranged in sequence from a zero bit position to an (n−1) bit position, a plurality n of output gates (e.g., tri-state buffers) each having a first input, a second input, and an output, a data output line commonly coupled to the output of each of the output gates, a plurality n/2 of NOR gates each having one or more data inputs, and a data output, and a plurality (n/2−1) of OR gates each having one or more data inputs, and a data output.

The data input(s) of each respective ith one of the NOR gates are respectively coupled to the zero bit position through ((n−1)−i) bit position bit(s) of the second one-hot input. The first input of each respective ith one of the output gates is coupled to the data output of a corresponding ith one of the NOR gates, and the second input of each respective ith one of the output gates is coupled to a corresponding ith bit position bit of the first one-hot input. The data input(s) of each respective jth one of the OR gates are respectively coupled to the (n−j) bit position through (n−1) bit position bits of the second one-hot input, where i=n/2 through (n−1), and j=(n/2−1) through 1. The first input of each respective jth one of the output gates is coupled to the data output of a corresponding jth one of the OR gates, and the second input of each respective jth one of the output gates is coupled to a corresponding jth bit position bit of the first one-hot input. The first input of a final one of the output gates is coupled to a reference potential, and the second input of the final one of the output gates is coupled to the zero bit position bit of the first one-hot input.

The present invention also encompasses a one-hot variable length decoder incorporating any of the above-referenced embodiments of the one-hot overflow matrix of the present invention.

BRIEF DESCRIPTION OF THE DRAWINGS

The above and other objects, features, and advantages of the present invention will become apparent from the following detailed description taken in conjunction with the accompanying drawings, in which.

DETAILED DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
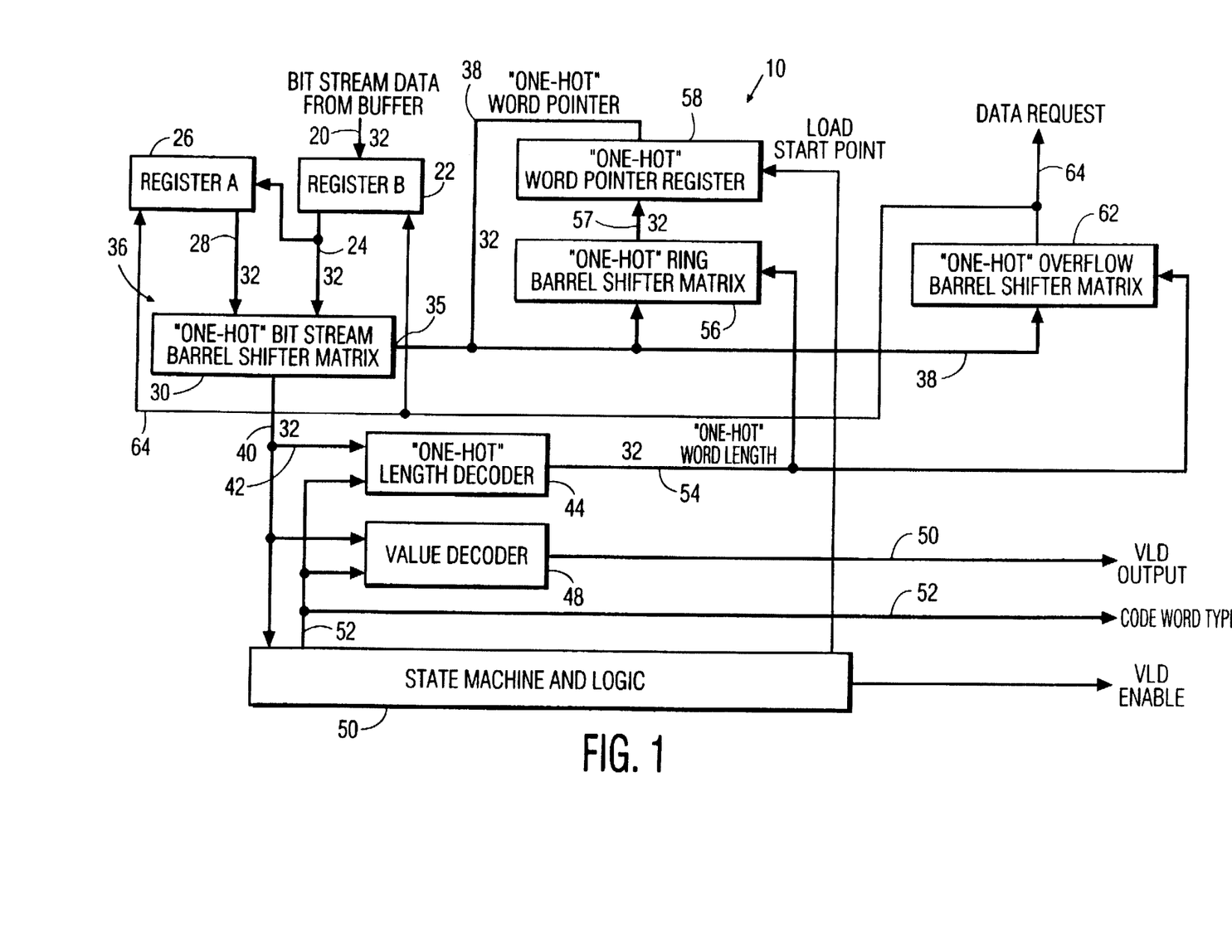
FIG. 1 is block diagram of a specific embodiment of the variable length decoder of the present invention.

FIG. 1 is a diagram of a specific embodiment of the variable length decoder 10 of the present invention. An input bit stream 20 contains code words to be decoded. In the present specific embodiment, the input bit stream 20 is an MPEG digital video data stream. A first register 22 is connected to a "one-hot" bit stream barrel shifter matrix 30 via thirty-two (32) parallel input bit lines 24, each line corresponding to a bit in the first register 22. A second register 26 is connected to the one-hot bit stream barrel shifter matrix 30 via thirty-two (32) parallel input bit lines 28, each line corresponding to a bit in the second register 26. Thus, a total of sixty-four (64) parallel input bit lines 24, 28 are connected to the one-hot bit stream barrel shifter matrix 30, thereby providing a corresponding sequence of sixty-four (64) available input bits for the one-hot bit stream barrel shifter matrix 30. The one-hot bit stream barrel shifter matrix 30 has a shift input 35 and thirty-two (32) parallel output bit lines 40 which define a decoding window 40. Those skilled in the art will appreciate that other numbers of parallel input bit lines 24, 28 and parallel output bit lines 40 may be utilized without departing from the spirit and scope of the present invention. In the present specific embodiment, the number of parallel input bit lines 24, the number of parallel input bit lines 28, and the number of parallel output bit lines 40 are each chosen to be equal in number to the maximum number of bits in a code word (i.e., maximum code word length).

Initially, in response to a data request signal applied over the line 64, a sequence of thirty-two bits representing code words to be decoded is loaded into the first register 22 from the input bit stream 20. Once the first register 22 is loaded with bits, the contents of the first register 22 are transferred to the second register 26 over thirty-two (32) parallel bit lines 24, and the next sequence of thirty-two bits from the input bit stream 20 is loaded into the first register 22. Thus, a sequence of sixty-four input bits is available to the one-hot bit stream barrel shifter matrix 30. The thirty-two parallel output bit lines 40 are chosen from the sixty-four parallel input bit lines 24, 28 in a manner discussed below, to thereby provide the decoding window 40. The decoding window 40 is shifted from left to right across the sequence of available input bits in response to a "one-hot" word pointer applied over thirty-two parallel bit lines 38 to the shift input 35 of the one-hot bit stream barrel shifter matrix 30. The decoding window 40 is shifted by the one-hot word pointer across the sequence of available input bits according to the length (or combined length) of the code word(s) decoded during a previous clock cycle, so that the start of a next code word(s) to be processed during the current clock cycle begins at the left edge of the decoding window 40. Thus, the one-hot word pointer applied over the lines 38 marks or points the left edge of the decoding window 40.

The variable length decoder 10 further includes a control circuit 50, which in the present implementation, is comprised of a state machine and associated logic circuitry which controls the operation of the variable length decoder 10 in accordance with a prescribed decoding protocol, e.g., an BEG protocol. In this connection, the control circuit 50 determines the types of code words to be decoded on the basis of current and previously decoded code words, and produces a code word type control signal which is applied over a line 52 to a one-hot length decoder 44 and a code word value decoder 48, and which is applied as a code word type stream on the line 52 as an output of the variable length decoder 10. The code word type control signal applied over the lines 52 selects the proper look-up table in the code word value decoder 48 and the one-hot length decoder 44 for decoding the value and length of a code word currently present in the decoding window 40, respectively.

The code word value decoder 48 outputs the decoded value of a code word in the decoding window 40 over an output line 50 of the variable length decoder 10.

The one-hot length decoder 44 outputs a thirty-two (32) bit wide one-hot word length signal which is applied over thirty-two corresponding parallel bit lines 54 to a shift input of a "one-hot" ring barrel shifter matrix 56, and to a shift input of a "one-hot" overflow barrel shifter matrix 62. The one-hot word length signal has a high value (high logic level voltage) only on the bit line whose position (number) corresponds to the length of the present code word being decoded. For example, a code word having a length of six bits would produce a high value ("1") on the sixth one of the bit lines 54, and a low value ("0") on the remaining ones of the bit lines 54. The name "one-hot" is derived from this fact.

The one-hot ring barrel shifter matrix 56 and the "one-hot" overflow barrel shifter matrix 62 function together as an "adder" of two one-hot numbers, i.e., the one-hot word pointer applied over the thirty-two parallel bit lines 38 and the one-hot word length applied over the thirty-two parallel bit lines 54. The "one-hot sum" of these two one-hot values is an updated one-hot word pointer which is stored in a one-hot word pointer register 58 via the parallel bit lines 57, for use in shifting the decoding window 40 in the next clock cycle. Due to its one-hot architecture, the ring barrel shifter matrix 56 has only one gate delay from any input to output. The contents of the one-hot word pointer register 58 are output over the lines 38 in the next clock cycle. Hence, the value of the one-hot word pointer applied over the lines 38 is increased by the length of the decoded code word represented by the one-hot word length signal applied over the lines 54.

The one-hot word pointer then shifts the decoding window 40 across the sequence of sixty-four available input bits to the beginning of the next code word to be decoded. The maximum value of the updated one-hot word pointer applied over the lines 57 to the data input of the one-hot word pointer register 58 is thirty-one. Assuming that bit positions are counted from zero to thirty-one, when the value of the one-hot word pointer would otherwise exceed thirty-one, an overflow is detected by the one-hot overflow barrel shifter matrix 62. When this occurs, the one-hot overflow barrel shifter matrix 62 generates the data request signal 64, which triggers a data reload operation as described hereinabove, i.e., the contents of the first register 22 are transferred to the second register 26, and a new sequence of bits from the input bit stream 20 is loaded into the first register 22. The resulting value of the one-hot word pointer, after the overflow is applied over the lines 38, is the difference between thirty-two and the larger sum that would be generated if there were no size limitations on the summing operation. For example, assume that the one-hot word pointer has a value of thirty. If the length of the next decoded code word is eight, the overflow will be triggered, and the resulting sum to be stored in the one-hot word pointer register 58 (i.e., the updated value of the one-hot word pointer) will be six.

Figure 2:
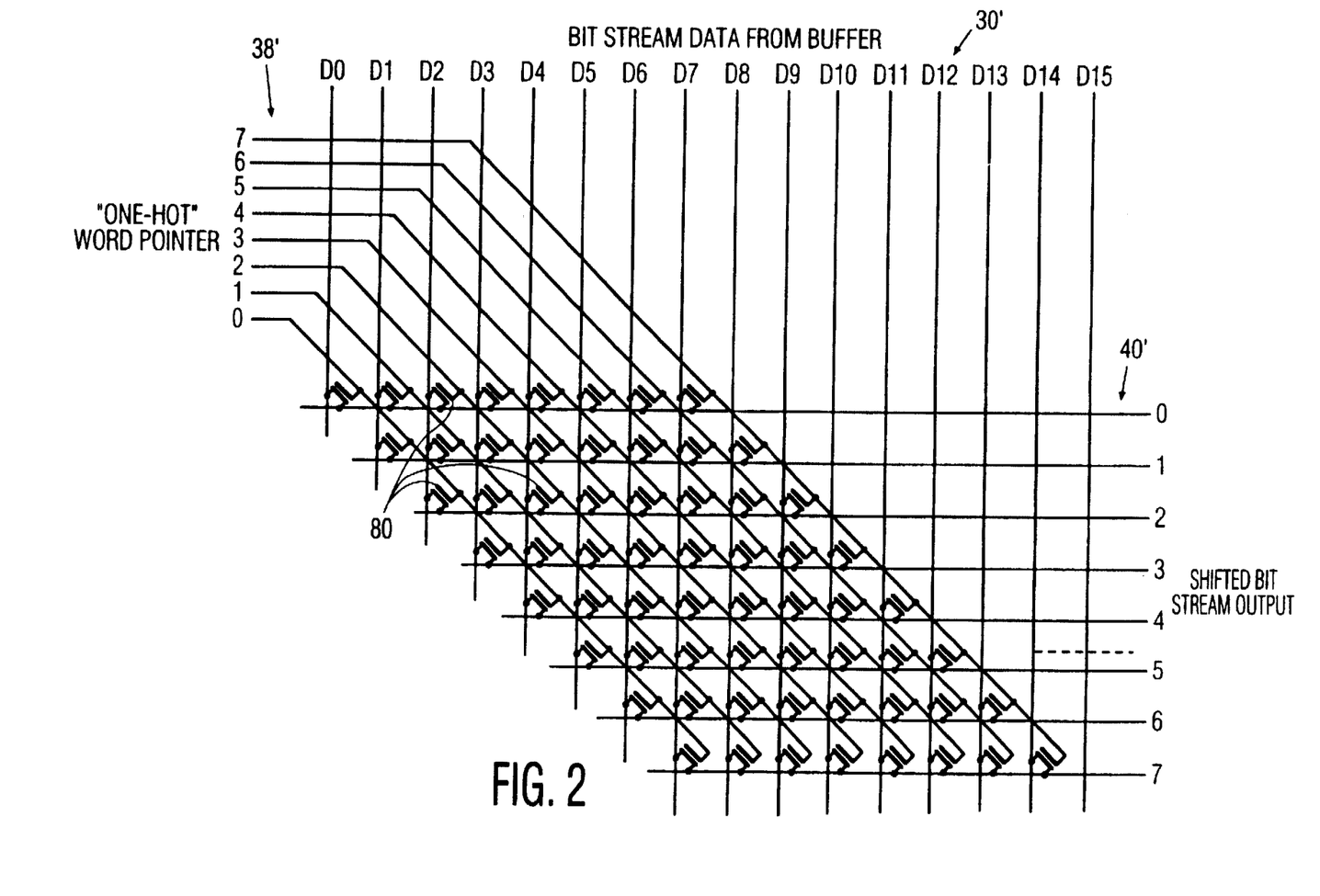
FIG. 2 is a schematic diagram of a "one-hot" bit stream barrel shifter matrix constructed in accordance with the teachings of the present invention.

FIG. 2 is diagram of a one-hot bit stream barrel shifter matrix 30' constructed in accordance with the teachings of the prior application. The one-hot bit stream barrel shifter matrix 30' is illustrated as an eight-bit implementation for ease of discussion, and of course is not limiting to the present invention. In the illustrative embodiment depicted in FIG. 2, the one-hot bit stream barrel shifter matrix 30' is comprised of a matrix of sixty-four ($8^2$) NMOS transistors 80. However, as will be readily appreciated by those skilled in the art, any other type of gate other than a transistor may be employed to implement the matrix, e.g., a tri-state buffers could be used rather than transistors. In this connection, the transistors 80 will hereinafter be referred to generically as gates 80. Each of the gates 80 has a control terminal (e.g., the gate electrode of an NMOS transistor), an input terminal (e.g., the drain electrode of an NMOS transistor), and an output terminal (e.g., the source electrode of an NMOS transistor). The decoding window 40' includes eight parallel output bit lines numbered 0–7, each of which is connected to the output terminals of the eight gates of a respective row of gates 80. The one-hot word pointer bit lines 38' numbered 0–7 are each connected to the control terminals of the eight gates of a respective column of gates 80. The sixteen parallel input bit lines D0–D15 are each connected to the input terminals of the gates 80 connected between respective ones of the word pointer bit lines 38' and the parallel output bit lines 40'.

An eight-bit one-hot word pointer applied over the bit lines 38' selects the appropriate shift of the decoding window 40'. In this connection, when the control terminal of a given one of the gates 80 is connected to the one of the bit lines 38' which has a logic high level ("1"), and an intersecting one of the parallel input bit lines D0–D15 which has a logic high level ("1"), that given one of the gates 80 is enabled (if a transistor, turned on), and a corresponding one of the parallel output bit lines 40' connected to the output terminal thereof is thereby driven to the logic high level ("1").

Each subsequent bit line of the one-hot word pointer parallel bit lines 38' connects a subsequent sequence of the parallel input bit lines (D0–D15) to the output decoding window 40' via corresponding enabled gates. For example, a high logic level of the fifth bit line of the one-hot word pointer parallel bit lines 38' will connect the fifth through twelfth parallel input bit lines D5–D12 to the bit lines 0–7 of the output decoding window 40'.

Table 1 illustrates the operation of the one-hot bit stream barrel shifter matrix 30' described above. As can be seen in Table 1, the (i)th bit of a sequence of bits in a code word is represented by D(i) where the integer (i) varies from zero to (x). In Table 1, x=14.

TABLE 1

| "ONE-HOT" WORD POINTER | | | | | | | | "ONE-HOT" BIT STREAM BARREL SHIFTER MATRIX OUTPUT | | | | | | | |
|---|---|---|---|---|---|---|---|---|---|---|---|---|---|---|---|
| 0 | 1 | 2 | 3 | 4 | 5 | 6 | 7 | 0 | 1 | 2 | 3 | 4 | 5 | 6 | 7 |
| 1 | 0 | 0 | 0 | 0 | 0 | 0 | 0 | D0 | D1 | D2 | D3 | D4 | D5 | D6 | D7 |
| 0 | 1 | 0 | 0 | 0 | 0 | 0 | 0 | D1 | D2 | D3 | D4 | D5 | D6 | D7 | D8 |
| 0 | 0 | 1 | 0 | 0 | 0 | 0 | 0 | D2 | D3 | D4 | D5 | D6 | D7 | D8 | D9 |
| 0 | 0 | 0 | 1 | 0 | 0 | 0 | 0 | D3 | D4 | D5 | D6 | D7 | D8 | D9 | D10 |
| 0 | 0 | 0 | 0 | 1 | 0 | 0 | 0 | D4 | D5 | D6 | D7 | D8 | D9 | D10 | D11 |
| 0 | 0 | 0 | 0 | 0 | 1 | 0 | 0 | D5 | D6 | D7 | D8 | D9 | D10 | D11 | D12 |
| 0 | 0 | 0 | 0 | 0 | 0 | 1 | 0 | D6 | D7 | D8 | D9 | D10 | D11 | D12 | D13 |
| 0 | 0 | 0 | 0 | 0 | 0 | 0 | 1 | D7 | D8 | D9 | D10 | D11 | D12 | D13 | D14 |

Figure 3:
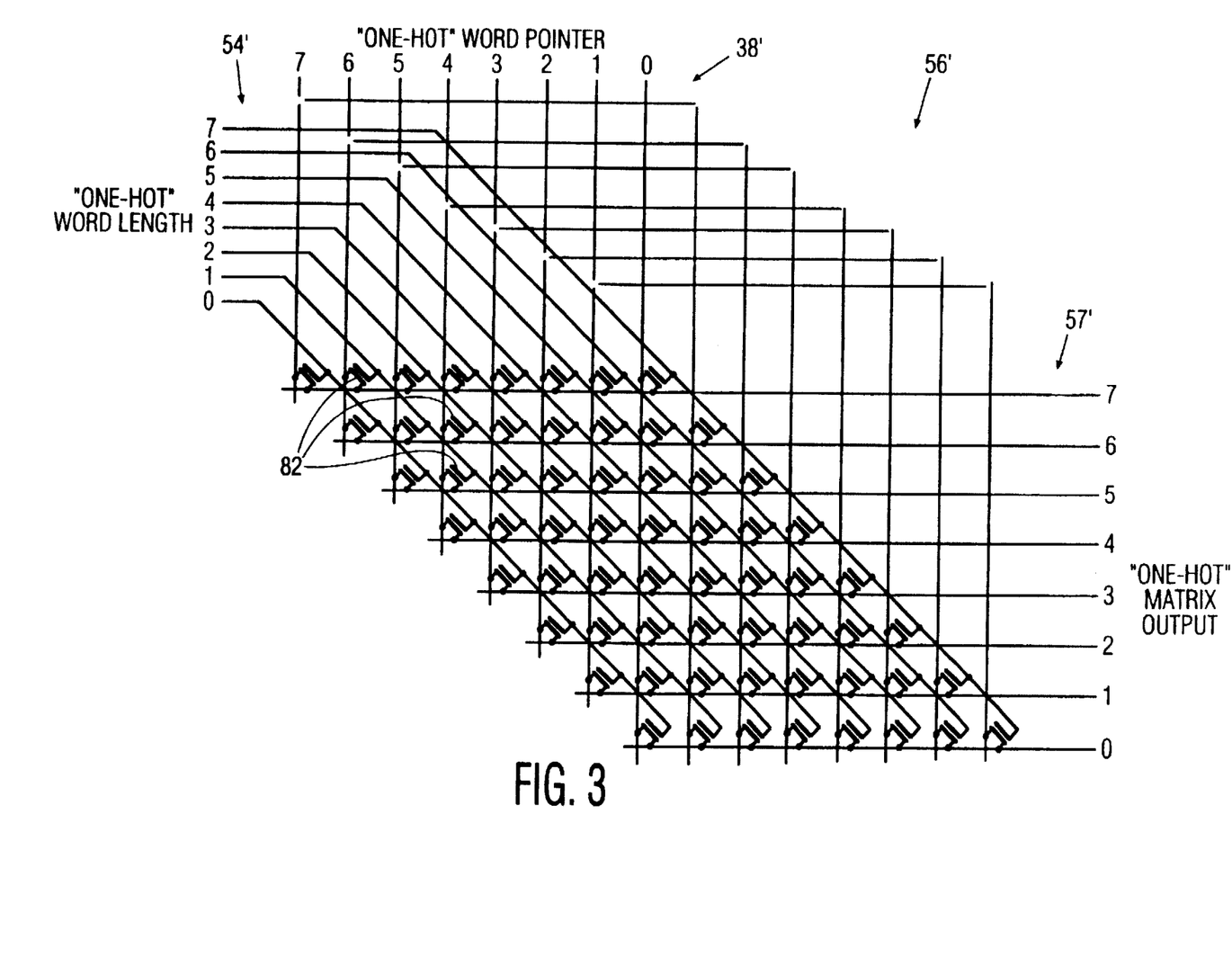
FIG. 3 is a schematic diagram of a "one-hot" ring barrel shifter matrix constructed in accordance with the teachings of the prior application.

FIG. 3 is a diagram of a one-hot ring barrel shifter matrix 56' constructed in accordance with the teachings of the prior application, using an 8-bit implementation (rather than the preferred 32-bit implementation), for illustrative purposes only. The one-hot ring barrel shifter matrix 56' performs an eight bit shift of the parallel output bit lines 57'. If the data applied over the data input lines 38' of the one-hot ring barrel shifter matrix 56' are represented in one-hot code, and the data applied over the lines 54' are represented in one-hot code, the result of such shift operation is a one-hot value at the output 57' which is equal to the arithmetic sum of the one-hot values on the lines 54' and 38'.

The one-hot ring barrel shifter matrix 56', in combination with the one-hot overflow barrel shifter matrix 62' depicted in FIG. 4, "adds" a one-hot word length 54' to a one-hot word pointer applied over the parallel bit lines 38'. If the addition of these two one-hot numbers is eight or larger, the resulting sum from the one-hot ring barrel shifter matrix 56' is the difference between eight, and the sum that is eight or larger. For example, five plus five results in a sum of two at an output bit line 57' of the one-hot ring barrel shifter matrix 56'. The sum of one plus seven is zero as performed by the one-hot ring barrel shifter matrix 56'. Every time the result is more than seven, the one-hot overflow barrel shifter matrix 62' generates a signal indicating this condition.

All input and output bit lines are labeled starting from zero rather than one so that addition will work properly. Each bit line of the one-hot word pointer bit lines 38' is connected to a respective one of the parallel output bit lines 57' via a respective one of the gates 82 which is controlled by a respective one of the one-hot word length bit lines 54'. Each bit line of the one-hot word pointer bit lines 38' is connected to each of the output bit lines 57' via respective ones of the gates 82, the control terminals of which are controlled by respective ones of the one-hot word length bit lines 54'.

Specifically, the bit (i) of the one-hot word pointer bit lines 38' is connected to the bit lines 0 through 7 of the output bit lines 57' via respective ones of the gates 82 controlled by the bit lines 0 through 7 of the one-hot word length bit lines 54'. In operation, a high logic level ("1") of bit line (i) of the one-hot word length bit lines 54' turns on all of the gates connecting each bit line of the output bit lines 57' to appropriate ones of the one-hot word pointer bit lines 38'. For example, a high logic level of the bit line 4 of the one-hot word length bit lines 54' turns on all of the gates 82 connecting bit line 7 through bit line 0 of the output bit lines 57' to the bit lines 3, 2, 1, 0, 7, 6, 5, and 4 of the one-hot word pointer bit lines 38'.

In the above example, if the bit line 2 of the one-hot word pointer bit lines 38' has a high logic level, the high logic level on the bit line 2 will be transferred to the bit line 6 of the output bit lines 57'. Hence, the position of bit 4 of the one-hot word length value applied over the bit lines 54' was added to the position of the bit line 4 of the one-hot word pointer applied over the bit lines 38' and output as a high logic level of the bit line 6 of the output bit lines 57'. As another example, if the bit line 7 of the one-hot word length bit lines 54' is high, and the bit line 7 of the one-hot word pointer bit lines 38' is high, then the bit line 6 of the output bit lines 57' will be driven to the high logic level. Since seven added to seven is fourteen, and fourteen minus eight is six, the high value on the bit line 6 of the output bit lines 57' is correct. Simultaneously, an overflow bit (signal) is generated by the one-hot overflow barrel shifter matrix 62' of FIG. 4.

FIG. 4 is a diagram of an overflow barrel shifter matrix 62' (implemented for n=8) constructed in accordance with the teachings of the prior application. The bit lines 1 through 7 of the one-hot word length lines 54' control gates 84 connecting the bit lines 1 through 7 of the one-hot word pointer bit lines 38' to respective inputs of an OR gate 72. The output of the OR gate 72 is the data request line 64'. When the data request line 64' transitions to a high logic level, new data is loaded into the variable length decoder (shown as 10 in FIG. 1). If the sum of the positions of the high bit lines of the one-hot word length bit lines 54' and the one-hot word pointer bit lines 38' is eight or larger, a high value will appear at the respective input of the OR gate 72. A high value at any input of the OR gate 72 produces a high value at the output of the OR gate 72, and hence, the data request line 64' is activated. With the above example of the one-hot addition of two numbers seven and seven, the lowest gate connected between the bit line 7 of the one-hot word pointer lines 38' and the bit line 7 of the one-hot word length lines 54' will be activated, thereby producing a logic "1" at the respective input of the OR gate 72.

Table 2 illustrates the operation of the one-hot ring barrel shifter matrix 56' and the one-hot overflow barrel shifter matrix 62' described above. Each bit of the one-hot word pointer applied over the bit lines 38', the one-hot word length bit lines 54', and the matrix output bit lines 57' are numbered according to the heading from bit 7 to bit 0.

TABLE 2

| "ONE-HOT" WORD POINTER | | | | | | | | "ONE-HOT" WORD LENGTH | | | | | | | | "ONE-HOT" RING MATRIX OUTPUT | | | | | | | | DATA REQUEST OVERFLOW |
|---|---|---|---|---|---|---|---|---|---|---|---|---|---|---|---|---|---|---|---|---|---|---|---|---|
| 7 | 6 | 5 | 4 | 3 | 2 | 1 | 0 | 7 | 6 | 5 | 4 | 3 | 2 | 1 | 0 | 7 | 6 | 5 | 4 | 3 | 2 | 1 | 0 | |
| 0 | 0 | 0 | 1 | 0 | 0 | 0 | 0 | 0 | 0 | 0 | 0 | 0 | 0 | 0 | 1 | 0 | 0 | 0 | 1 | 0 | 0 | 0 | 0 | 0 |
| 0 | 0 | 0 | 1 | 0 | 0 | 0 | 0 | 0 | 0 | 0 | 0 | 0 | 0 | 1 | 0 | 0 | 0 | 1 | 0 | 0 | 0 | 0 | 0 | 0 |
| 0 | 0 | 0 | 1 | 0 | 0 | 0 | 0 | 0 | 0 | 0 | 0 | 0 | 1 | 0 | 0 | 0 | 1 | 0 | 0 | 0 | 0 | 0 | 0 | 0 |
| 0 | 0 | 0 | 1 | 0 | 0 | 0 | 0 | 0 | 0 | 0 | 0 | 1 | 0 | 0 | 0 | 1 | 0 | 0 | 0 | 0 | 0 | 0 | 0 | 0 |
| 0 | 0 | 0 | 1 | 0 | 0 | 0 | 0 | 0 | 0 | 0 | 1 | 0 | 0 | 0 | 0 | 0 | 0 | 0 | 0 | 0 | 0 | 0 | 1 | 1 |
| 0 | 0 | 0 | 1 | 0 | 0 | 0 | 0 | 0 | 0 | 1 | 0 | 0 | 0 | 0 | 0 | 0 | 0 | 0 | 0 | 0 | 0 | 1 | 0 | 1 |
| 0 | 0 | 0 | 1 | 0 | 0 | 0 | 0 | 0 | 1 | 0 | 0 | 0 | 0 | 0 | 0 | 0 | 0 | 0 | 0 | 0 | 1 | 0 | 0 | 1 |
| 0 | 0 | 0 | 1 | 0 | 0 | 0 | 0 | 1 | 0 | 0 | 0 | 0 | 0 | 0 | 0 | 0 | 0 | 0 | 0 | 1 | 0 | 0 | 0 | 1 |

The above table (Table 2) illustrates the addition of the one-hot word pointer fixed valve for to the one-hot word length values from zero to seven. The result of this addition is reflected in the output 57' of the one-hot ring barrel shifter matrix 56' with the overflow signal generated as described above. Therefore, it has been illustrated that if two numbers at the data input and the shift input of the one-hot ring barrel shifter matrix 56' are represented in one-hot code code, then the value of the output 57' will represent their one-hot sum with the overflow generated as necessary by the one-hot overflow barrel shifter matrix 62'. Therefore, it can be understood that the much slower adder (having layers of logic gates) used in the conventional variable length decoders (such as the one disclosed in the hereinabove-referenced Sun et al. patent) is replaced by the much faster one-hot addition circuit comprised of the one-hot ring barrel shifter matrix 56' and the one-hot overflow barrel shifter matrix 62'.

As was discussed previously, although the specific implementation of the one-hot overflow matrix 62' depicted in FIG. 4 herein is theoretically capable of introducing a signal propagation delay between the input and output thereof equal to the combined propagation delay of just two logic gates (e.g., the propagation delay of a tri-state buffer+the propagation delay of an OR gate), in actual practice, the signal propagation delay introduced by a one-hot overflow matrix with this architecture is greater than this for one-hot inputs (i.e., one-hot word length and one-hot word pointer inputs) having a number of bits n greater than x, where x is the maximum number of inputs for an OR gate readily available in silicon, e.g., n=5. In this connection, when the one-hot VLD is implemented in silicon (preferably in CMOS), an OR gate having 31 inputs (as would be required for the case where n=32) is not readily available in most ASIC ("Application Specific Integrated Circuit") libraries, and is normally implemented by cascading several OR gates of smaller width.

Consequently, when the value of n>x, the one-hot overflow matrix implemented with an architecture such as shown in FIG. 4, in actual practice, due to unavailability of CMOS ASICs having non-cascaded OR gates with the requisite number of inputs, introduces a signal propagation delay from equivalent to the propagation delay of three to four cascaded OR gates, thereby significantly decreasing the actually realizable speed of operation of the one-hot VLD, and thus minimizing the actual benefits derived from using the one-hot VLD, i.e., increased speed of the word length computation loop and increased throughput. In other words, the one-hot overflow matrix depicted in FIG. 4 imposes an impractical constraint on the speed of the word length computation loop which can be actually realized by using the one-hot VLD, and thus, on the throughput of the one-hot VLD.

In addition, the one-hot overflow matrix 62' depicted in FIG. 4 requires pull-down resistors to be connected to the respective inputs of the OR gate 72, since any input of the OR gate 72 could otherwise be put into an undefined ("floating") state if none of the gates 84 connected to this input are enabled, thereby creating uncertainty of the output signal generated by the one-hot overflow matrix 62' (i.e., the overflow signal/bit). Moreover, the fact that such pull-down resistors are not available in most ASIC high-speed CMOS libraries imposes an additional practical constraint of the implementation of the one-hot VLD 10 using the one-hot overflow matrix 62' depicted in FIG. 4.

Figure 5:
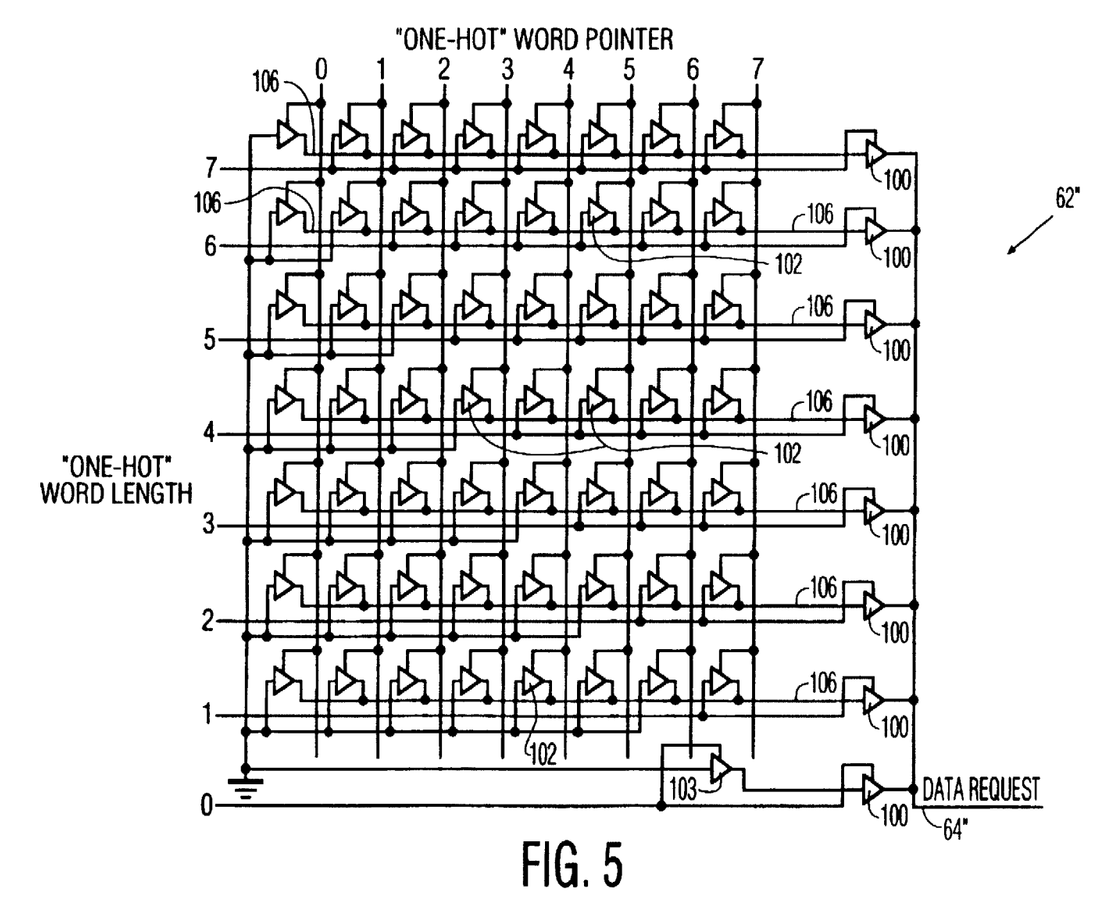
FIG. 5 is a schematic diagram of a "one-hot" overflow matrix constructed in accordance with a first embodiment of the present invention; and, FIG. 6 is a schematic diagram of a "one-hot" overflow matrix constructed in accordance with a second, preferred embodiment of the present invention.

Thus, in accordance with a first embodiment of the present invention, the one-hot overflow matrix 62" depicted in FIG. 5 is provided in order to reduce the signal propagation delay introduced by the one-hot overflow matrix, and thereby accelerate the word length computation loop of the one-hot VLD 10. As can be readily seen, the OR gate 72 of the one-hot overflow matrix 62' depicted in FIG. 4 is replaced with a plurality n of output gates 100, which, as shown, are preferably tri-state buffers, where n is the number of bits in the one-hot word length input and in the one-hot word pointer input, e.g., as shown in FIG. 5, n=8.

As can be seen in FIG. 5, the one-hot overflow matrix 62" includes n rows of gates 102 (e.g., tri-state buffers 102), with each of the n rows including n tri-state buffers, except the bottom row, corresponding to bit 0 of the one-hot word length input, which only includes a single tri-state buffer 103. Thus, the one-hot overflow matrix 62" requires a total of $n^2+1$ tri-state buffers 100, 102, 103 (as opposed to the n(n−1)/2 gates required for the one-hot overflow matrix 62' depicted in FIG. 4). For n=32, the one-hot overflow matrix 62" includes 1025 tri-state buffers, compared to 496 for the one-hot overflow matrix 62'. However, the total signal propagation delay through the one-hot overflow matrix 62" depicted in FIG. 5 is equal to the combined delay of two tri-state buffers, regardless of how large n is. Moreover, the one-hot overflow matrix 62" does not require any pull-down resistors because exhaustive logic determination is implemented for every electrical signal inside of the matrix 62", and for every possible combination of one-hot word length input bits and one-hot word pointer input bits, as explained below.

More particularly, bit 7 of the one-hot word length input is coupled to the data input of each of the last seven ones of the top row of tri-state buffers 102, corresponding to bits 1–7 of the one-hot word pointer input. The data input of the first tri-state buffer 102 of the top row of tri-state buffers 102, corresponding to bit 0 of the one-hot word pointer input, is connected to a reference potential, e.g., as shown in FIG. 5, ground. The control inputs of respective ones of the top row of tri-state buffers 102 are coupled to corresponding ones of the bits of the one-hot word pointer input. Bit 7 of the one-hot word length input is also coupled to the control input of the corresponding output tri-state buffer 100. The outputs of each one of the top row of tri-state buffers 102 are commonly coupled to a corresponding buffer output line 106 which is coupled to the data input of the corresponding output tri-state buffer 100.

With this configuration, it can be readily appreciated that if any one of the bits 1–7 of the one-hot word pointer is logic high ("hot"), and bit 7 of the one-hot word length is logic high ("hot"), then the corresponding output tri-state buffer 100 is enabled, thereby generating an overflow signal on the data request line 64" commonly coupled to the outputs of each of the output tri-state buffers 100. Of course, this is proper since the one-hot sum of the one-hot word length and one-hot word pointer inputs would be ≧n in this case.

A similar analysis can be applied to the remainder of the one-hot overflow matrix 62" in order to establish that all one-hot sums which are ≧n will result in the generation of an overflow signal on the data request line 64". In general, the architecture of the one-hot overflow matrix 62" of the present invention can be described as including a plurality n of output gates each having a first input, a second input, and an output, a tri-state buffer matrix comprised of a plurality n of rows of tri-state buffers, including n−1 non-zero-bit rows of tri-state buffers, each non-zero-bit row including a plurality n of tri-state buffers, and a single zero-bit row comprised of a single tri-state buffer, each of the tri-state buffers having a data input, a control input, and an output, a plurality n of buffer output lines, respective ith ones of the buffer output lines being commonly coupled to the output of each tri-state buffer of a corresponding ith row of the tri-state buffers, and a data output line (data request line) commonly coupled to the output of each of the output gates.

The data input of the first j ones of the tri-state buffers of each ith non-zero-bit row of the tri-state buffers are each coupled to a reference potential (e.g., ground), and the data input of the next k ones of the tri-state buffers of each ith non-zero-bit row of the tri-state buffers are each coupled to the corresponding ith non-zero bit of the one-hot word length input, where i=0 through (n−1); j=n−i; k=i, and, j+k=n.

Although the one-hot overflow matrix 62" depicted in FIG. 5 is faster and technologically superior to the one-hot overflow matrix 62' depicted in FIG. 4, is still introduces a signal propagation delay which is of a greater magnitude than the signal propagation delay introduced by the one-hot ring barrel shifter matrix 56' depicted in FIG. 3, thereby limiting the achievable speed of the word length computation loop of the one-hot VLD 10. For example, the one-hot overflow matrix 62" implemented in 0.5 μm ASIC core, for n=32, introduces a signal propagation delay of about 4.5 ns.

It has been determined that the propagation delay between the one-hot word length input to the data request output of the overflow matrix is much more critical to the speed of the word length computation loop than is the propagation delay between the one-hot word pointer to the data request output of the overflow matrix. This is because the one-hot word pointer is a registered signal, whereas the one-hot word length input is a signal which has already suffered a significant amount of combinatorial delay in the one-hot barrel shifter and the one-hot length decoder. Consequently, the shortest combinatorial path in the one-hot overflow matrix should be between the one-hot word length input and the data request output of the overflow matrix, in order to optimize the VLD speed improvement.

Figure 6:
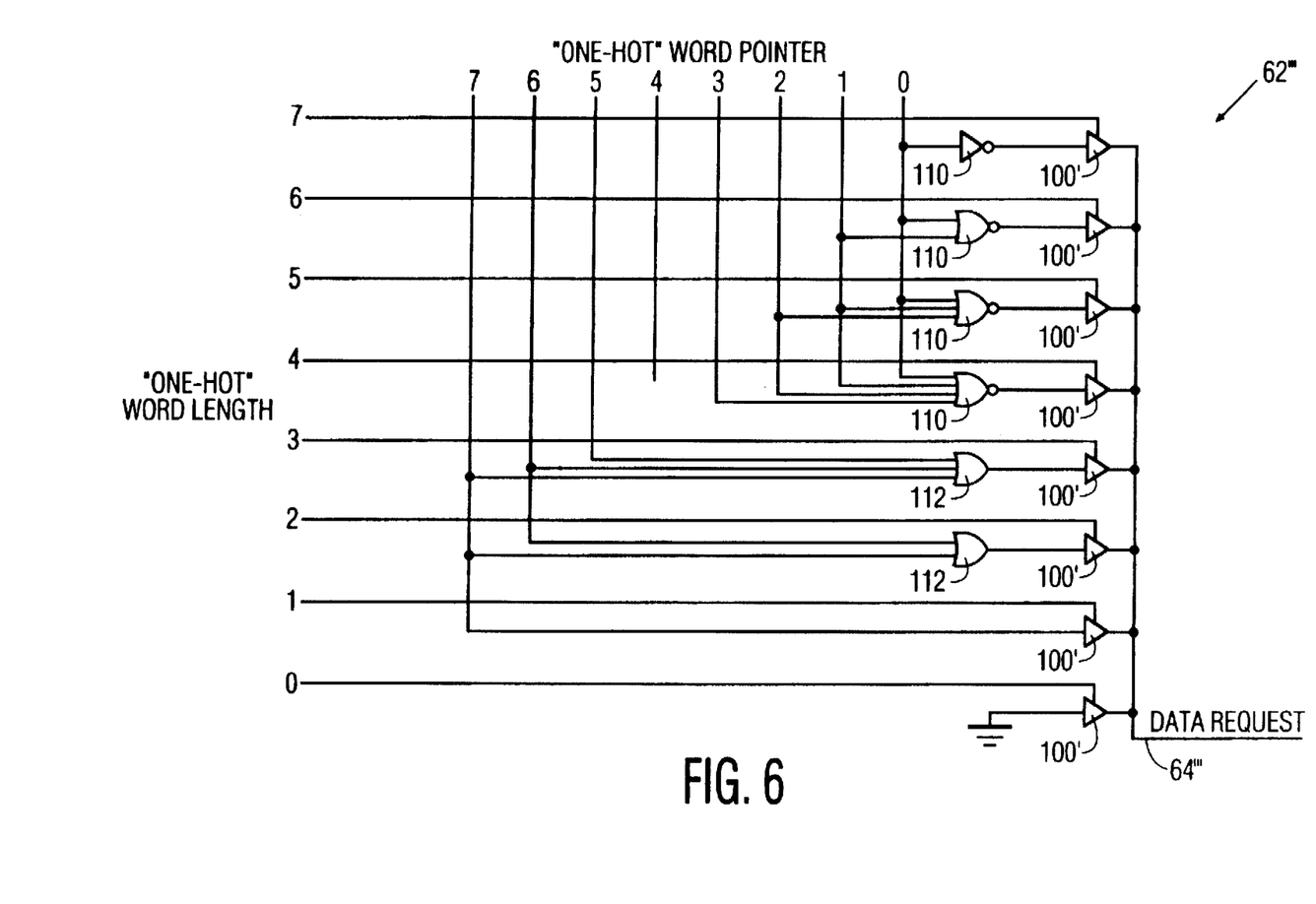

In accordance with the above analysis, in accordance with a second, preferred embodiment of the present invention, the one-hot overflow matrix 62‴ depicted in FIG. 6 is provided in order to further reduce the signal propagation delay introduced by the one-hot overflow matrix, and thereby further accelerate the word length computation loop of the one-hot VLD 10.

As can be seen in FIG. 6, the one-hot overflow matrix 62‴ of this preferred embodiment includes n output gates (e.g., tri-state buffers) 100' whose outputs are commonly coupled to a data request line 64‴, n/2 NOR gates 110 having a number of inputs varying from 1 to n/2 (a NOR gate with one input is logically equivalent to an inverter), and (n/2−1) OR gates 112 having a number of inputs varying from (n/2−1) to 1 (an OR gate with a single input is logically equivalent to a wire). Thus, none of the logic gates has more than n/2 inputs, thereby rendering practical the implementation of the one-hot overflow matrix in CMOS using a readily available ASIC core. In this connection, implementation of the one-hot overflow matrix 62‴ in 0.5 μm ASIC core, for n=32, results in the most critical propagation delay from the one-hot word length input to the data request output of the overflow matrix being equal approximately 1.2 ns, and the less critical delay from the one-hot word pointer input to the data request output of the overflow matrix being equal to about 3.2 ns.

Thus, with this architecture, the "effective" signal propagation delay introduced by the one-hot overflow matrix 62‴ is equal to a single gate delay, e.g., 1.2 ns, thereby significantly enhancing the speed of the word length computation loop, and thus, the speed of operation of the one-hot VLD 10. Further, with this architecture of the one-hot overflow matrix, the propagation delays through the one-hot barrel shifer and one-hot overflow matrix are equalized.

To demonstrate the operation of the one-hot overflow matrix 62‴, a particular case in which bit 6 of the one-hot word length input is logic high ("hot") and any of bits 2–7 of the one-hot word pointer are logic high ("hot") will be considered. More particularly, if any of bits 2–7 of the one-hot word pointer are logic high, then the output of the NOR gate 110 whose inputs are coupled to bits 0 and 1 of the one-hot word pointer input will be logic high (since bits 0 and 1 must both be low in this case), and if bit 6 of the one-hot word length input is logic high, then the control input of the corresponding output tri-state buffer 100' will be logic high. Thus, an overflow signal will be generated on the data request line 64‴. Of course, this is the proper result, since the one-hot sum of the one-hot word length and one-hot word pointer inputs is ≧n (i.e., 8) in this case.

A similar analysis can be applied to the remainder of the one-hot overflow matrix 62‴ in order to establish that all one-hot sums which are ≧n will result in the generation of an overflow signal on the data request line 64‴. In general, the architecture of the one-hot overflow matrix 62‴ of the preferred embodiment of the present invention can be described as including a plurality n of output gates (e.g., tri-state buffers) each having a first input, a second input, and an output, a data output line (data request line) commonly coupled to the output of each of the output gates, a plurality n/2 of NOR gates each having one or more data inputs, and a data output, and a plurality (n/2−1) of OR gates each having one or more data inputs, and a data output.

The data input(s) of each respective ith one of the NOR gates are respectively coupled to the zero bit position through ((n−1)−i) bit position bit(s) of the one-hot word pointer input. The first input of each respective ith one of the output gates is coupled to the data output of a corresponding ith one of the NOR gates, and the second input of each respective ith one of the output gates is coupled to a corresponding ith bit position bit of the one-hot word length input. The data input(s) of each respective jth one of the OR gates are respectively coupled to the (n–j) bit position through (n–1) bit position bits of the one-hot word pointer input, where i=n/2 through (n–1), and j=(n/2–1) through 1. The first input of each respective jth one of the output gates is coupled to the data output of a corresponding jth one of the OR gates, and the second input of each respective jth one of the output gates is coupled to a corresponding jth bit position bit of the one-hot word length input. The first input of a final one of the output gates is coupled to a reference potential, and the second input of the final one of the output gates is coupled to the zero bit position bit of the one-hot word length input.

The one-hot architecture of the word length computation loop of the variable length decoder of the present invention significantly reduces the propagation delay through the word length computation loop relative to the word length computation loop used in the conventional variable length decoders, such as the one disclosed in the above-referenced Sun et al. patent, and the word length computation loop which uses the one-hot overflow matrix 62' described in the prior application and depicted in FIG. 4 herein (for n greater than some critical value x), and thereby greatly accelerates the word length computation loop, thus facilitating greater throughput.

Further, by replacing the relatively slow adder-accumulator circuit of the conventional variable length decoders with the disclosed one-hot adder-accumulator circuit, a one-hot word pointer is produced that will not require additional decoding at the shift input of the one-hot bit stream barrel shifter matrix.

Additionally, the one-hot operation of the one-hot word length decoder is accelerated due to the elimination of the logic required in the conventional word length decoder to produce a 5-bit encoded length value, as opposed to a 32-bit (for example) one-hot word length value, which can be viewed as a "one-out-of-N" data representation. In this regard, the one-hot word length computation loop of the present invention eliminates the layers of logic gates required in the conventional word length computation loop, which includes a wide barrel shifter, a conventional word length decoder, and an adder-accumulator.

With the one-hot architecture of the word length computation loop of a preferred embodiment of the present invention, the wide barrel shifter is replaced by a "one-hot" bit stream barrel shifter matrix, the conventional word length decoder is replaced by a "one-hot" word length decoder, and the adder is replaced by a "one-hot" ring barrel shifter matrix and "one-hot" overflow barrel shifter matrix. Alternatively, significant acceleration of the word length computation loop can be achieved even if conventional barrel shifters are used instead of the "one-hot" barrel shifter matrices.

Regardless of the implementation, the critical path of a barrel shifter is between its shift input (normally 5 bits for MPEG-2) and the output. With the barrel shifters used in conventional variable length decoders, the shift input has to be internally decoded. Each of the barrel shifter outputs is derived as a logical OR of the outputs of 32 logic AND gates, where each of these 32 AND gates has a different data input and a decoded shift input. Decoding the shift input code requires a few extra gate delays for its implementation in silicon. Using the one-hot architecture for the bit stream barrel shifter eliminates these delays. Furthermore, the barrel shifter itself can be implemented as a true matrix with only one gate delay.

The 5-bit adder used in the conventional variable length decoders is normally implemented using several layers of logic gates. Replacing the 5-bit adder with the one-hot ring barrel shifter matrix in combination with the one-hot overflow barrel shifter matrix reduces the propagation delay to a single gate delay if they are implemented as true matrices.

The word length decoder used in the conventional variable length decoders include a complex, multiplexed look-up table where some arithmetic operations are also possible. Replacing the conventional word length decoder with the one-hot word length decoder greatly reduces the amount of required logic, and therefore, significantly lowers propagation delays.

The matrix barrel shifter implementation throughout this one-hot architecture provides a very high speed of operation. The fact that the shift input is fully decoded (one-hot) allows it to be applied directly to the matrices without using decoding circuits included in the barrel shifters used in conventional variable length decoders. The propagation delay through all barrel shifter matrices is therefore equal to a single gate delay. Overall, a very significant speed improvement is achieved as by the combination of these individual gains. It should be clearly understood that the one-hot architecture is not limited to that of the illustrative embodiment of the variable length decoder of the present invention described hereinabove. Rather, the one-hot architecture disclosed herein can be advantageously employed in a variable length decoder having virtually any configuration. For example, using the one-hot architecture of the present invention in the variable length decoder disclosed in a co-pending U.S. patent application entitled "High Performance Variable Length Decoder With Enhanced Throughput Due to Tagging of the Input Bit Stream and Parallel Processing of Contiguous Code Words", by M. Bakhmutsky, the disclosure of which is herein incorporated by reference, throughputs in excess of 200 million code words per second can be achieved.

To further enhance the speed of operation of the variable length decoder of the present invention, a "one-hot" state machine well-known to those skilled in the art can be used in the control circuit 50 in place of a conventional state machine. The one-hot state machine normally runs faster than a conventional state machine, and provides the additional benefit of fully decoded word type select control signals that will accelerate the length and value decoding operations.

Although first and second embodiments of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A one-hot overflow matrix, comprising:
    a first one-hot input comprised of a plurality n of parallel bits;
    a second one-hot input comprised of a plurality n of parallel bits;
    a plurality n of output gates, each of said output gates including a first input, a second input, and an output;
    a logic matrix comprised of a plurality n of rows and a plurality n of columns of matrix gates, each of said matrix gates having a data input, a control input, and an output;

a plurality n of buffer output lines, respective ith ones of said buffer output lines being commonly coupled to said output of each matrix gate of a corresponding ith row of said matrix gates;

a data output line commonly coupled to said output of each of said output gates;

wherein said data input of the first j ones of said matrix gates of each ith row of said matrix gates are each coupled to a reference potential, and said data input of the next k ones of said matrix gates of each ith row of said matrix gates are each coupled to the corresponding ith bit of said first one-hot input;

wherein said control input of each one of said matrix gates of each ith column of said matrix gates are coupled to the corresponding ith bit of said second one-hot input;

wherein said output of each of said matrix gates of each ith row of said matrix gates is coupled to a common ith one of said buffer output lines;

wherein said first input of each ith one of said output gates is coupled to the corresponding ith bit of said one-hot input, and said second input of each ith one of said output gates is coupled to the corresponding ith one of said buffer output lines; and, wherein i=0 through(n-1); j=n-i; k=i, and, j+k=n.

2. The one-hot overflow matrix as set forth in claim 1, wherein:

each of said output gates and each of said matrix gates comprises a tri-state buffer; and, said first input of each said output gate comprises a control input and said second input of each said output gate comprises a data input.

3. The one-hot overflow matrix as set forth in claim 1, wherein said first one-hot input comprises a one-hot word length input.

4. The one-hot overflow matrix as set forth in claim 3, wherein said second one-hot input comprises a one-hot word pointer input.

5. The one-hot overflow matrix as set forth in claim 4, wherein said data output line comprises a data request line.

6. A one-hot overflow matrix, comprising:

a first one-hot input comprised of a plurality n of parallel bits;

a second one-hot input comprised of a plurality n of parallel bits;

a plurality n of output gates, each of said output gates including a first input, a second input, and an output;

a logic matrix comprised of a plurality n of rows of matrix gates, including n-1 non-zero-bit rows of matrix gates including n columns of matrix gates, and a single zero-bit row comprised of a single matrix gate, each of said matrix gates having a data input a control input, and an output;

a plurality n of buffer output lines, respective ith ones of said buffer output lines being commonly coupled to said output of each matrix gate of a corresponding ith row of said matrix gates;

a data output line commonly coupled to said output of each of said output gates;

wherein said data input of the first j ones of said matrix gates of each ith non-zero-bit row of said matrix gates are each coupled to a reference potential, and said data input of the next k ones of said matrix gates of each ith non-zero-bit row of said matrix gates are each coupled to the corresponding ith non-zero bit of said first one-hot input;

wherein said data input of said single matrix gate of said zero-bit row is coupled to said reference potential;

wherein said control input of each one of said matrix gates of each ith column of said matrix gates are coupled to the corresponding ith bit of said second one-hot input;

wherein said control input of said single matrix gate of said zero-bit row is coupled to the corresponding zero bit of said first one-hot input;

wherein said output of each of said matrix gates of each ith row of said matrix gates is coupled to a common ith one of said buffer output lines;

wherein said first input of each ith one of said output gates is coupled to the corresponding ith bit of said one-hot input, and said second input of each ith one of said output gates is coupled to the corresponding ith one of said buffer output lines; and, wherein i=0 through (n-1); j=n-i; k=i, and, j+k=n.

7. The one-hot overflow matrix as set forth in claim 6, wherein:

each of said output gates and each of said matrix gates comprises a tri-state buffer; and, said first input of each of said output gates comprises a control input, and said second input of each of said output gates comprises a data input.

8. The one-hot overflow matrix as set forth in claim 6, wherein said first one-hot input comprises a one-hot word length input.

9. The one-hot overflow matrix as set forth in claim 8, wherein said second one-hot input comprises a one-hot word pointer input.

10. The one-hot overflow matrix as set forth in claim 9, wherein said data output line comprises a data request line.

11. A one-hot overflow matrix, comprising:

a first one-hot input comprised of a plurality n of parallel bits arranged in sequence from a zero bit position to an (n-1) bit position;

a second one-hot input comprised of a plurality n of parallel bits arranged in sequence from a zero bit position to an (n-1) bit position;

a plurality n of output gates, each of said output gates including a first input, a second input, and an output;

a data output line commonly coupled to said output of each of said output gates;

a plurality n/2 of NOR gates each having one or more data inputs, and a data output;

a plurality (n/2-1) of OR gates each having one or more data inputs, and a data output;

wherein said data input(s) of each respective ith one of said NOR gates are respectively coupled to the zero bit position through ((n-1)-i) bit position bit(s) of said second one-hot input;

wherein said first input of each respective ith one of said output gates is coupled to said data output of a corresponding ith one of said NOR gates, and said second input of each respective ith one of said output gates is coupled to a corresponding ith bit position bit of said first one-hot input;

wherein said data input(s) of each respective jth one of said OR gates are respectively coupled to the (n-j) bit position through (n-1) bit position bits of said second one-hot input;

wherein said fist input of each respective jth one of said output gates is coupled to said data output of a corresponding jth one of said OR gates, and said second input of each respective jth one of said output gates is coupled to a corresponding jth bit position bit of said first one-hot input;

wherein said first input of a final one of said output gates is coupled to a reference potential, and said second input of said final one of said output gates is coupled to the zero bit position bit of said first one-hot input; and, wherein i=n/2 through (n−1), and j=(n/2−1) through 1.

12. The one-hot overflow matrix as set forth in claim 11, wherein:

each of said output gates comprises a tri-state buffer; and, said first input of each of said output gates comprises a data input, and said second input of each of said output gates comprises a control input.

13. The one-hot overflow matrix as set forth in claim 11, wherein said first one-hot input comprises a one-hot word length input.

14. The one-hot overflow matrix as set forth in claim 13, wherein said second one-hot input comprises a one-hot word pointer input.

15. The one-hot overflow matrix as set forth in claim 14, wherein said data output line comprises a data request line.

16. The one-hot overflow matrix as set forth in claim 11, wherein a final one of said OR gates comprises a wire coupled to said second input of a corresponding one of said output gates.

17. A high speed variable length decoder for decoding code words contained in an input bit stream which includes a plurality of code words, comprising:

an input circuit for receiving the input bit stream and for providing a decoding window that includes a parallel sequence of bits which includes one or more code words to be decoded at an output thereof;

a one-hot word length decoder connected to said decoding window for generating a one-hot word length signal indicative of the length of a code word(s) in said decoding window;

a shift circuit for generating a one-hot word pointer for shifting said decoding window across a parallel sequence of available input bits to a next code word to be decoded, said shift circuit having a first input coupled to said one-hot word pointer, and a second input coupled to said one-hot word length signal;

a code word value decoder circuit for determining the values of said code words to be decoded and for providing said decoded values at an output of said variable length decoder;

wherein said shift circuit includes:

a one-hot ring barrel shifter matrix for adding said one-hot word length signal to said one-hot word pointer to produce a sum which constitutes an updated one-hot word pointer for use in a next clock cycle;

a one-hot word pointer register for storing said updated one-hot word pointer until said next clock cycle; and, a one-hot overflow matrix having a first input connected to said one-hot word pointer and a second input connected to said one-hot word length signal, for generating an overflow signal for requesting a new sequence of bits from said input bit stream to be loaded into said input means in the event of overflow of said one-hot ring barrel shifter matrix; and, wherein said one-hot overflow matrix includes:

a first one-hot input comprised of a plurality n of parallel bits arranged in sequence from a zero bit position to an (n−1) bit position;

a second one-hot input comprised of a plurality n of parallel bits arranged in sequence from a zero bit position to an (n−1) bit position;

a plurality n of output gates, each of said output gates including a first input, a second input, and an output;

a data output line commonly coupled to said output of each of said output gates;

a plurality n/2 of NOR gates each having one or more data inputs, and a data output;

a plurality (n/2−1) of OR gates each having one or more data inputs, and a data output;

wherein said data input(s) of each respective ith one of said NOR gates are respectively coupled to the zero bit position through ((n−1)−i) bit position bit(s) of said second one-hot input;

wherein said first input of each respective ith one of said output gates is coupled to said data output of a corresponding ith one of said NOR gates, and said second input of each respective ith one of said output gates is coupled to a corresponding ith bit position bit of said first one-hot input;

wherein said data input(s) of each respective jth one of said OR gates are respectively coupled to the (n−j) bit position through (n−1) bit position bits of said second one-hot input;

wherein said first input of each respective jth one of said output gates is coupled to said data output of a corresponding jth one of said OR gates, and said second input of each respective jth one of said output gates is coupled to a corresponding jth bit position bit of said first one-hot input;

wherein said first input of a final one of said output gates is coupled to a reference potential, and said second input of said final one of said output gates is coupled to the zero bit position bit of said first one-hot input; and, wherein i=n/2 through (n−1), and j=(n/2−1) through 1.

18. A high speed variable length decoder for decoding code words contained in an input bit stream which includes a plurality of code words, comprising:

an input circuit for receiving the input bit stream and for providing a decoding window that includes a parallel sequence of bits which includes one or more code words to be decoded at an output thereof;

a one-hot word length decoder connected to said decoding window for generating a one-hot word length signal indicative of the length of a code word(s) in said decoding window;

a shift circuit for generating a one-hot word pointer for shifting said decoding window across a parallel sequence of available input bits to a next code word to be decoded, said shift circuit having a first input coupled to said one-hot word pointer, and a second input coupled to said one-hot word length signal;

a code word value decoder circuit for determining the values of said code words to be decoded and for providing said decoded values at an output of said variable length decoder;

wherein said shift circuit includes:

a one-hot ring barrel shifter matrix for adding said one-hot word length signal to said one-hot word pointer to produce a sum which constitutes an updated one-hot word pointer for use in a next clock cycle;

a one-hot word pointer register for storing said updated one-hot word pointer until said next clock cycle; and, a one-hot overflow matrix having a first input connected to said one-hot word pointer and a second input connected to said one-hot word length signal, for generating an overflow signal for requesting a new sequence of bits from said input bit stream to be loaded into said input means in the event of overflow of said one-hot ring barrel shifter matrix; and, wherein said one-hot overflow matrix includes:

a first one-hot input comprised of a plurality n of parallel bits;

a second one-hot input comprised of a plurality n of parallel bits;

a plurality n of output gates, each of said output gates including a first input, a second input, and an output;

a logic matrix comprised of a plurality n of rows and a plurality n of columns of matrix gates, each of said matrix gates having a data input, a control input, and an output;

a plurality n of buffer output lines, respective ith ones of said buffer output lines being commonly coupled to said output of each matrix gate of a corresponding ith row of said matrix gates;

a data output line commonly coupled to said output of each of said output gates;

wherein said data input of the first j ones of said matrix gates of each ith row of said matrix gates are each coupled to a reference potential, and said data input of the next k ones of said matrix gates of each ith row of said matrix gates are each coupled to the corresponding ith bit of said first one-hot input;

wherein said control input of each one of said matrix gates of each ith column of said matrix gates are coupled to the corresponding ith bit of said second one-hot input;

wherein said output of each of said matrix gates of each ith row of said matrix gates is coupled to a common ith one of said buffer output lines;

wherein said first input of each ith one of said output gates is coupled to the corresponding ith bit of said one-hot input, and said second input of each ith one of said output gates is coupled to the corresponding ith one of said buffer output lines; and, wherein i=0 through (n−1); j=n−i; k=i, and, j+k=n.

19. A high speed variable length decoder for decoding code words contained in an input bit stream which includes a plurality of code words, comprising:

an input circuit for receiving the input bit stream and for providing a decoding window that includes a parallel sequence of bits which includes one or more code words to be decoded at an output thereof;

a one-hot word length decoder connected to said decoding window for generating a one-hot word length signal indicative of the length of a code word(s) in said decoding window;

a shift circuit for generating a one-hot word pointer for shifting said decoding window across a parallel sequence of available input bits to a next code word to be decoded, said shift circuit having a first input coupled to said one-hot word pointer, and a second input coupled to said one-hot word length signal;

a code word value decoder circuit for determining the values of said code words to be decoded and for providing said decoded values at an output of said variable length decoder;

wherein said shift circuit includes:

a one-hot ring barrel shifter matrix for adding said one-hot word length signal to said one-hot word pointer to produce a sum which constitutes an updated one-hot word pointer for use in a next clock cycle;

a one-hot word pointer register for storing said updated one-hot word pointer until said next clock cycle; and, a one-hot overflow matrix having a first input connected to said one-hot word pointer and a second input connected to said one-hot word length signal, for generating an overflow signal for requesting a new sequence of bits from said input bit stream to be loaded into said input means in the event of overflow of said one-hot ring barrel shifter matrix; and, wherein said one-hot overflow matrix includes:

a first one-hot input comprised of a plurality n of parallel bits;

a second one-hot input comprised of a plurality n of parallel bits;

a plurality n of output gates, each of said output gates including a first input, a second input, and an output;

a logic matrix comprised of a plurality n of rows of matrix gates, including n−1 non-zero-bit rows of matrix gates including n columns of matrix gates, and a single zero-bit row comprised of a single matrix gate, each of said matrix gates having a data input, a control input, and an output;

a plurality n of buffer output lines, respective ith ones of said buffer output lines being commonly coupled to said output of each matrix gate of a corresponding ith row of said matrix gates;

a data output line commonly coupled to said output of each of said output gates;

wherein said data input of the first j ones of said matrix gates of each ith non-zero-bit row of said matrix gates are each coupled to a reference potential, and said data input of the next k ones of said matrix gates of each ith non-zero-bit row of said matrix gates are each coupled to the corresponding ith non-zero bit of said first one-hot input;

wherein said data input of said single matrix gate of said zero-bit row is coupled to said reference potential;

wherein said control input of each one of said matrix gates of each ith column of said matrix gates are coupled to the corresponding ith bit of said second one-hot input;

wherein said control input of said single matrix gate of said zero-bit row is coupled to the corresponding zero bit of said first one-hot input;

wherein said output of each of said matrix gates of each ith row of said matrix gates is coupled to a common ith one of said buffer output lines;

wherein said first input of each ith one of said output gates is coupled to the corresponding ith bit of said one-hot input, and said second input of each ith one of said output gates is coupled to the corresponding ith one of said buffer output lines; and, wherein i=0 through (n−1); j=n−i; k=i, and, j+k=n.

* * * * *